(12) United States Patent
Vornicu et al.

(10) Patent No.: US 11,747,194 B2
(45) Date of Patent: Sep. 5, 2023

(54) OR PULSE COMBINATION DIGITAL PHOTOMULTIPLIER

(71) Applicants: CONSEJO SUPERIOR DE INVESTIGACIONES CIENTIFICAS (CSIC), Madrid (ES); UNIVERSIDAD DE SEVILLA, Seville (ES)

(72) Inventors: Ion Vornicu, Seville (ES); Ricardo Carmona Galán, Seville (ES); Ángel Rodríguez Vázquez, Seville (ES)

(73) Assignees: CONSEJO SUPERIOR DE INVESTIGACIONES CIENTIFICAS (CSIC), Madrid (ES); UNIVERSIDAD DE SEVILLA, Seville (ES)

( * ) Notice: Subject to any disclaimer, the term of this patent is extended or adjusted under 35 U.S.C. 154(b) by 0 days.

(21) Appl. No.: 17/799,804

(22) PCT Filed: Feb. 11, 2021

(86) PCT No.: PCT/ES2021/070098
§ 371 (c)(1),
(2) Date: Jan. 5, 2023

(87) PCT Pub. No.: WO2021/160916
PCT Pub. Date: Aug. 19, 2021

(65) Prior Publication Data
US 2023/0132965 A1 May 4, 2023

(30) Foreign Application Priority Data
Feb. 14, 2020 (ES) .............................. ES202030127

(51) Int. Cl.
*G01J 1/44* (2006.01)
(52) U.S. Cl.
CPC ......... *G01J 1/44* (2013.01); *G01J 2001/4453* (2013.01); *G01J 2001/4466* (2013.01)

(58) Field of Classification Search
CPC ................ G01J 1/44; G01J 2001/4453; G01J 2001/4466; G01J 2001/442; G01J 1/429; H01L 31/02027; G01T 1/248; H10K 39/30
See application file for complete search history.

(56) References Cited

U.S. PATENT DOCUMENTS 11,035,725 B2 * 6/2021 Katz ................. H01L 31/02005
11,340,109 B2 * 5/2022 Hennecke ............. G01S 7/4863
(Continued)

FOREIGN PATENT DOCUMENTS

CN     106338339 A     1/2017
CN     107222694 A     9/2017
(Continued)

OTHER PUBLICATIONS

Mst Shamim Ara Shawkat and Nicole McFarlane, "A CMOS Perimeter Gated SPAD Based Digital Silicon Photomultiplier with Asynchronous AER Readout for PET Applications", IEEE Biomedical Circuits and Systems Conference (BioCAS), 2018, 4 pages.
(Continued)

*Primary Examiner* — Seung C Sohn
(74) *Attorney, Agent, or Firm* — Hayes Soloway PC

(57) ABSTRACT

The photomultiplier includes a set of macrocells, each comprising at least two microcells, each being connected to an output node according to an OR diagram, and achieving great energy efficiency upon deactivating each of the microcells when these are activated almost simultaneously, and that otherwise would have been masked by the OR diagram. To this end, each of the microcells comprises an active quenching and recharge circuit; an avalanche diode; a first deactivation transistor with its gate connected to an external processor, and its drain and source associated with the active quenching and recharge circuit; a second deactivation transistor with its gate connected to an external processor, and
(Continued)

its source associated with the active quenching and recharge circuit.

4 Claims, 2 Drawing Sheets

(56) References Cited

U.S. PATENT DOCUMENTS

| | | |
|---|---|---|
| 2006/0202129 A1 | 9/2006 | Niclass et al. |
| 2015/0285625 A1 | 10/2015 | Deane |
| 2017/0242136 A1 | 8/2017 | O'Neill et al. |

FOREIGN PATENT DOCUMENTS

| | | |
|---|---|---|
| EP | 2645131 A2 | 2/2013 |
| WO | 2013018006 A1 | 2/2013 |

OTHER PUBLICATIONS

Erdogan et al., A CMOS SPAD Line Sensor With Per-Pixel Histogramming TDC for Time-Resolved Multispectral Imaging, IEEE Journal of Solid-State Circuits, 2019, vol. 54, Issue 6, pp. 1705-1719, 15 pages.

\* cited by examiner

OR PULSE COMBINATION DIGITAL PHOTOMULTIPLIER

CROSS-REFERENCE TO RELATED APPLICATIONS AND PRIORITY

This patent application claims priority from PCT Application No. PCT/ES2021/070098 filed Feb. 11, 2021, which claims priority from Spanish Patent Application No. P202030127 filed Feb. 14, 2020. Each of these patent applications are herein incorporated by reference in their entirety.

OBJECT OF THE INVENTION

The object of the invention is a digital photomultiplier with a series of microcells each comprising an active quenching and recharge (AQR) circuit with a variable dead time, and combined according to an OR diagram. Great efficiency in energy use is obtained upon deactivating each of the individual microcells from the rest of the microcells when these are activated almost simultaneously, since they would otherwise have been masked by the OR diagram.

BACKGROUND OF THE INVENTION

Silicon photomultipliers (SiPMs) consist of arrays of single-photon avalanche diodes (SPADs) that share, in the most basic diagram, an output node. Each SPAD accompanied by its quenching resistance constitutes a microcell. The avalanche currents generated in the microcells are added to a common node, obtaining a current that constitutes the output of the photomultiplier.

The main problem with this analogue SiPM diagram is that the avalanche currents develop at their maximum amplitude and can reach a very considerable magnitude. This represents power consumption that is too high for some applications.

In addition to this, the quenching resistance is designed in such a way that with little current a pulse is produced in sufficient voltage to take the diode out of the breakdown voltage. The problem with this is that the diode recharges through the same resistance, which, as it is so high, leads to long recharge times. This means that the device will be unable to capture a new photon for an excessively long, dead time, period. This pile-up phenomenon of photons leads to an error in the resolution with which the energy of the pulse is measured and in determining the time of flight.

Given that the information provided by each SPAD is binary, that is, the detection of a photon is deduced from the existence of an avalanche, regardless of the magnitude of the avalanche current, allowing the avalanche to evolve is an unnecessary energy expense.

Digital silicon photomultipliers (d-SiPM) solve this by incorporating a monostable to a microcell that generates a pulse of limited duration associated with the start of each avalanche. This monostable is part of an active quenching and recharge circuit. Since the magnitude of the avalanche does not provide additional information, the active quenching circuit stops the avalanche very early, reducing power consumption, and speeds up the recharging of the diode to an acceptable, and usually adjustable, dead time with the consequent reduction of the pile-up.

The pulses generated by the microcells are conducted towards the same node, to count and time them, in order to obtain estimates of the number of photons detected and the time of flight, respectively. To combine the pulses that come from different microcells, an OR tree is usually used, which adds all the pulses except those that are less than the new dead time delimited by the duration of the pulses of the monostable.

The main problem with this d-SiPM diagram is the reduction of the fill factor (FF), which implies a loss of sensitivity. This reduction is due, on the one hand, to the fact that the active quenching and recharge circuit occupies a larger area than the quenching resistance, which means that the FF of the microcell decreases and, consequently, that of the SiPM itself.

On the other hand, pulse counting and timing circuits, time-to-digital converters (TDC) also occupy an area that is otherwise intended to detect photons. The number of counters and TDCs is the result of a compromise between spatial and temporal resolution. If we had as many as microcells, the reduction of the sensitive area could be unacceptable. If we reduce the number of counters and TDCs, pile-up is again generated with the consequent loss of photons.

An example of the state of the art would be document WO2013018006A1, which describes a photon detector that includes a SPAD array with circuitry to determine the position of the SPADs that have made a detection.

This device comprises elements configured to store the position coordinates within the array of those SPADs that have been triggered. In order to determine the row to which the SPAD that has been triggered belongs, all the SPADs belonging to the same row share an OR gate that combines the outputs. Similarly, all the SPADs that belong to the same column share an OR gate that allows the determination of the column in which the SPAD that has been triggered is found.

Furthermore, document US2006202129A1 describes an integrated circuit with an array of microcells, each of them composed of a SPAD, a buffer to shape the digital output pulse and several transistors that act as a driver for a column bus connected either to a TDC or to an asynchronous digital counter. The possibility of decoupling the pixel readout circuit by means of a transformer is also considered.

Document US2017242136A1 describes a semiconductor photomultiplier (SPM) device. The SPM comprises a set of photosensitive elements, connected to a first electrode arranged to provide a bias voltage to these photosensitive elements.

It also comprises a set of resistive elements for quenching the avalanche, each associated with a corresponding photosensitive element. These resistive elements are connected at the other end to a second electrode arranged as a bias electrode. Coupled to each of the nodes that join a photosensitive element to a resistive element, there is a capacitive load in parallel with another resistive load and possibly a diode, which are all connected to a common third electrode to provide an output signal of the device.

DESCRIPTION OF THE INVENTION

An aspect of the described d-SiPM architecture that has not been previously considered is the unnecessary power consumption introduced by the avalanches that occur within the dead time. These avalanches will generate a pulse that will not exceed the OR combination and therefore will not be counted. Our proposal consists of associating N microcells in a macrocell in which the photodiodes are deactivated during the dead time that occurs after the triggering of an avalanche in one of the diodes thereof.

The invention described is therefore a digital photomultiplier based on macrocells containing: N avalanche photodiodes, an active avalanche quenching and recharge circuit for each very compact and low-consumption diode, with a shared monostable that gives rise to an adjustable dead time, and a mechanism for combining the pulses generated by the SPADs that make up the macrocell that reduces power consumption.

This macrocell is compatible with detection diagrams in digital silicon photomultipliers in which an OR combination of the pulses is performed. The key to energy efficiency lies in the fact that the triggering of an avalanche in one of the SPADs prevents the rest of the SPADs in the macrocell from triggering.

This aspect is important when designing large digital photomultipliers, since there is a need for each microcell to have a minimum consumption and a minimum noise level. It is desirable, in these conditions, to take into account the limitations of the OR pulse combination techniques.

In OR combination diagrams, a whole series of cells with avalanche diodes that are sensitive to a single photon converge in the same channel, such that their outputs are combined in a logical OR. Each of these cells comprises an avalanche diode that is sensitive to single photon events and a quenching and recharge circuit that can be active or passive.

In the case of using a passive quenching and recharge circuit, high energy consumption is produced since the amplitude of the pulses and their width are controlled by the same element, which is not desirable to achieve high pulse compression.

In addition, in this type of OR combination diagrams, when several detections occur simultaneously in several of the avalanche diodes, it is not possible to differentiate at the common output in which of the diodes the detection has occurred. In addition, this overlap of detections tends to occur between diodes that are adjacent, that is, that belong to the same macrocell. Therefore, the diodes with overlapping detections are consuming energy unnecessarily.

In a conventional OR combination diagram, the avalanches that are generated in adjacent cells almost at the same time as the first one are masked by the pulse combination system, so there is useless energy consumption, since these avalanches do not provide additional information. This unnecessary consumption can be critical when designing photomultipliers with a large number of sensing elements.

In order to address these problems, the present invention has been developed, which consists of an OR pulse combination digital photomultiplier that is made up of macrocells. Each of these macrocells comprises at least two microcells, each of the microcells being connected to an output node according to an OR diagram. The grouping of microcells reduces the quenching and recharge circuitry by sharing some transistors, which results in an improvement of the FF.

Each of the microcells comprises an active quenching and recharge (AQR) circuit block. Each of the blocks is made up of a series of transistors, the arrangement of which will be explained later, and is associated with a point through which a signal can be introduced that starts active recharging.

Likewise, an avalanche diode that is sensitive to single photon events is positioned in each of the microcells, with its anode connected to the active quenching and recharge circuit, a first deactivation transistor with its gate connected to an external processor, and its drain and source associated with the active quenching and recharge circuit, and a second deactivation transistor with its gate connected to an external processor, its drain associated with the output node and its source associated with the active quenching and recharge circuit.

This set may further comprise a high-level attachment transistor with its drain connected to the common node.

As indicated, the active quenching and recharge circuit comprises, in a preferred embodiment of the invention, four transistors. A first transistor with its gate connected to the source of the second deactivation transistor, its drain connected to the anode of the avalanche diode and its source connected to a node common to the microcells; a second transistor with its gate connected to the source of the second deactivation transistor, its drain connected to the drain of the first deactivation transistor and its source connected to an activation signal input; a third transistor with its gate connected to the point through which the start signal of the active recharge is received, its drain connected to the source of the first deactivation transistor and its source connected to the common node between microcells, and a fourth transistor with its gate connected to the drain of the first deactivation transistor, its drain connected to the source of the second activation transistor and its source connected to earth.

Each macrocell of the photomultiplier object of the invention can additionally comprise a monostable for the generation of the start signal for the active recharge connected to the active recharge circuit.

The macrocell of the exposed digital photomultiplier has a number of advantages:
  compactness: it is achieved by sharing the control electronics, that is, the connection to a single external processor, between all the microcells of the same macrocell, thus reaching a 30% filling factor (FF). The active quenching and recharge circuit of each avalanche diode is implemented by four transistors. Compared to a microcell containing a passive quenching and recharge circuit, the proposed quenching and recharge block represents only a 13% penalty in filling factor, which can be compensated by using microlenses,
  energy efficiency: the proposed macrocell benefits from an inherent limitation to OR pulse combination by deactivating the microcells of each macrocell when a pulse overlap occurs.

DESCRIPTION OF THE DRAWINGS

In order to complement the description being made and with the object of helping to better understand the features of the invention, in accordance with a preferred practical exemplary embodiment thereof, said description is accompanied, as an integral part thereof, by a set of drawings where, in an illustrative and non-limiting manner, the following has been represented.

PREFERRED EMBODIMENT OF THE INVENTION

A preferred embodiment of the present invention is described below with the help of FIGS. 1 and 2.

Figure 1:
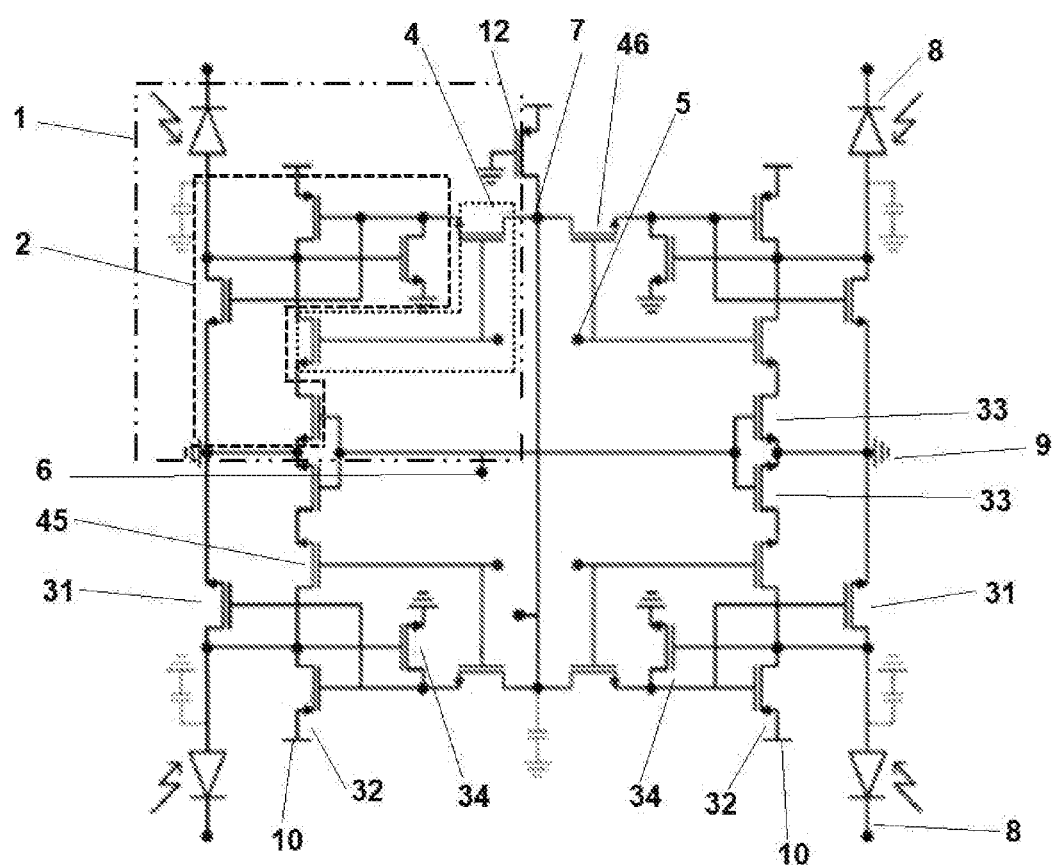
FIG. 1 shows a schematic view of a macrocell of the OR pulse combination digital photomultiplier in an embodiment with four microcells.

FIG. 1 shows a diagram of a macrocell of the OR pulse combination digital photomultiplier object of the invention, which in this embodiment comprises microcells (1), specifically four. Each of the microcells (1) is connected to an output node (7), according to an OR diagram.

Each of the microcells (1) comprises an active quenching and recharge circuit (2). In turn, each of these active quenching and recharge circuits (2) comprises four transistors (3).

In addition, each of the microcells (1) comprises a point through which it receives the start signal of the active recharge (6) associated with each active quenching and recharge circuit (2).

Each of the microcells (1) also has an avalanche diode (8) that is sensitive to single photon events or SPAD (Single Photon Avalanche Diode), with its anode connected to the active quenching and recharge circuit (2).

Lastly, each of the microcells (1) comprises a first deactivation transistor (45) with its gate connected to an external processor (5), its drain connected to the drain of the second transistor (32) and its source connected to the drain of the third transistor (33), and a second deactivation transistor (46) with its gate connected to an external processor (5), its drain associated with the output node (7) and its source connected to the drain of the fourth transistor (34).

Both the first deactivation transistor (45) and the second deactivation transistor (46) are intended to deactivate the microcell (1) in which they are comprised, such that the microcells (1) can be deactivated completely individually from one another.

As indicated, the gates of the deactivation transistors (45, 46) are connected to an external processor (5), specifically to single random access memory (SRAM). This is necessary to be able to turn off the noisy avalanche diodes (8) when operating in normal mode or to measure the intercommunication or cross-talk between microcells (1) when the circuit is being characterized.

However, in those technologies that have sufficiently low dark count rates (DCR) per unit area, the deactivation transistors (45, 46) are not necessary.

All the microcells (1) are connected to an output node (7). In addition, an output node (7) is located between the drains of two of the second deactivation transistors (46). A high-level attachment transistor (12) is connected to this output node (7) by its drain.

The transistors (3) of each of the microcells (1) are connected as described below. The first transistor (31) has its gate connected to the source of the second deactivation transistor (46), its drain connected to the anode of the avalanche diode (8) and its source connected to a junction node between microcells (9). The second transistor (32) has its gate connected to the source of the second deactivation transistor (46), its drain connected to the drain of the first deactivation transistor (45), and its source connected to an activation signal input.

The third transistor (33) has its gate connected to the active recharge activation point (6), its drain connected to the source of the first deactivation transistor (45) and its source connected to the node between microcells (9), and the fourth transistor (34) with its gate connected to the drain of the first deactivation transistor (45), its drain connected to the source of the second activation transistor (46), and its source connected to earth.

Although four microcells (1) are shown in this embodiment, the present invention allows an architecture with multiple microcells (1) to be developed.

Figure 2:
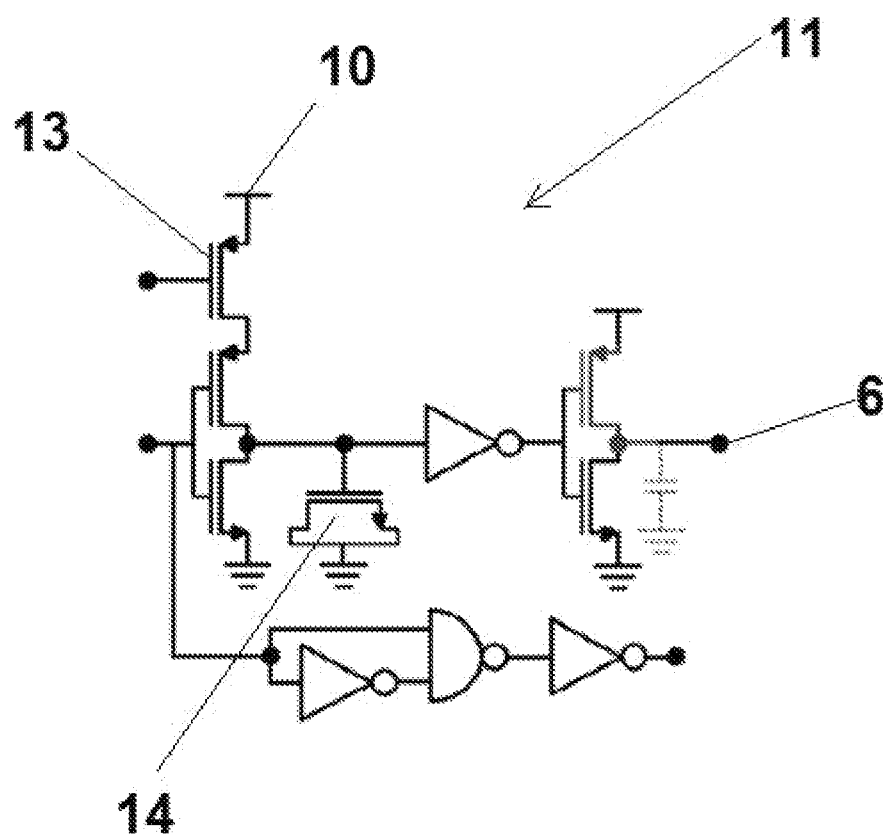
FIG. 2 shows a schematic view of the monostable.

The start signal of the active recharge is introduced at the active recharge activation point (6) through a monostable (11), the embodiment of which is shown in detail in FIG. 2. The monostable (11) has a variable dead time or DT, such that it is possible to find an optimal value for the width of the output pulse, so that the correlated noise has a minimum value. Once the optimal value has been determined, the areas of a variable resistor (13) and a MOS capacitor (14) comprised in the monostable (11) can be optimised.

The operation of the macrocell of the digital photomultiplier object of the present invention is explained below. It is assumed that all microcells (1) are enabled through the external processor (5), and that a pulse has been introduced as an active recharge signal at the active recharge activation point (6). As a consequence, all the avalanche diodes (8) are recharged by bringing the voltage from their anodes to earth, through the third transistor (33) and the first deactivation transistor (45).

This turns off the fourth transistor (34) in each of the microcells (1), leaving the output node (7) to be activated at an activation voltage VDD through the high-level attachment transistor (12). As a consequence, the second transistors (32) are deactivated and the first transistors (31) are activated, which keeps the anodes of the avalanche diodes (8) connected to earth and ready to be triggered.

Furthermore, if the activation voltage VDD is reached at the output node, then at the active recharge activation point (6) the voltage is reduced, turning off the third transistors (33). Lastly, the MOS capacitor (14) of the monostable (11) is discharged.

Next, it is assumed that the avalanche diode (8) of the microcell (1) in the upper left corner of FIG. 1 is activated, due to either a spurious or a true detection, which causes the voltage to begin to increase in its anode. Consequently, the fourth transistor (34) of this microcell (1) turns on and begins to reduce the voltage at the output node (7) through the second deactivation transistor (46). Previously, the voltage at the output node (7) was maintained solely by the second deactivation transistor (46).

In addition, the second transistor (32) is activated, increasing the voltage at the anode of the single photon avalanche diode (8) even faster. This occurs with the activation of a positive feedback loop between the second transistor (32) and the fourth transistor (34).

The reduction of the voltage at the output node (7) turns off the first transistor (31). When the voltage at the anode of the single photon avalanche diode (8) reaches the activation voltage VDD, the avalanche diode (8) turns off, and remains in this state until a start signal of the active recharge arrives through the active recharge activation point (6).

What happens in the rest of the microcells (1) is now analysed. The first detection caused by the single photon avalanche diode (8) of the upper left microcell (1) causes a negative transition of the voltage in the output node (7). As a consequence, the second transistor (32) and the fourth transistor (34) disable the first transistor (31) in each of the rest of the microcells (1), setting the activation voltage VDD to the voltage at the anode of the avalanche diodes (8) and deactivating the avalanche diodes (8). These remain in this state until the arrival of a new signal through the activation node of the active recharge (6).

Now analysing FIG. 2, the negative transition of the voltage at the output node (7) activates a charge path through the variable resistor (13) of the monostable (11). The MOS capacitor (14) starts to charge with the time constant set by the delay time.

When the voltage in the MOS capacitor (14) reaches a certain value, then the active recharge activation point (6) is activated, turning on all the third transistors (33) of each of the microcells (1).

Then, all the voltages at the anodes of the single photon avalanche diodes (8) change to zero, the fourth transistors (34) are turned off, the voltage at the output node (7) is activated solely through the high-level attachment transistor (12) which turns off the second transistors (32) and turns on the first transistors (31) recharging all the single photon avalanche diodes.

When the voltage at the output node (7) reaches the activation voltage VDD, the MOS capacitor (14) rapidly discharges, turning off the active recharge signal at the active recharge activation point (6).

At this point, all the microcells (1) are armed, waiting for a detection that can activate any of them. If more than one microcell (1) is activated at the same time, the macrocell of the photomultiplier behaves similarly to the way that has been explained, such that the rest of the microcells (1) are disabled as explained above.

In short, any microcell (1) that is activated by a first detection automatically disables the rest of the microcells (1).

This diagram allows energy savings so that the rest of the detections that occur after a first detection will be masked with the OR combination diagram between all the microcells (1).

Lastly, the deactivation mechanism of each individual microcell (1) will be presented. It is assumed that the active recharge signal introduced through the active recharge activation point (6) of the microcell positioned in the upper left corner of FIG. 1 is zero, which turns off the first deactivation transistor (45) and the second deactivation transistor (46). This decouples said microcell (1) from the output node (7) of the macrocell of the photomultiplier.

If the avalanche diode (8) of said microcell (1) had been recharged before being deactivated, then it is ready to be activated again, after remaining turned off while the active recharge signal is at zero. This occurs thanks to the paired second transistor (32) and fourth transistor (34), which lock the active recharge signal at zero.

This makes it possible to deactivate each of the microcells (1) that constitute a macrocell, using only one NMOS transistor, without the need for any additional PMOS transistor to raise the anode of the avalanche diode (8) to the activation voltage VDD.

If a PMOS transistor had been used, as in other embodiments of the state of the art, it must have been connected between the anode of the avalanche diode (8) and the activation voltage VDD, its gate being controlled by the active recharge signal. This represents a significant improvement in the filling factor (FF).

The invention claimed is:

1. An OR pulse combination digital photomultiplier, comprising at least one macrocell, each of which comprises at least two microcells, each of the microcells being connected to an output node according to an OR diagram and each of the microcells comprising:
    an active quenching and recharge circuit,
    an active recharge activation point associated with the active quenching and recharge circuit,
    an avalanche diode sensitive to a single photon, with an anode connected to the active quenching and recharge circuit,
    a first deactivation transistor with a gate connected to an external processor, and a drain and source associated with the active quenching and recharge circuit,
    a second deactivation transistor with a gate connected to an external processor, a drain connected to the output node and a source associated with the active quenching and recharge circuit.

2. The photomultiplier of claim 1, wherein the at least one macrocell further comprises a high-level attachment transistor with a drain connected to the output node.

3. The photomultiplier of claim 1, wherein the active quenching and recharge circuit comprises:
    a first transistor with a gate connected to the source of the second deactivation transistor, a drain connected to the anode of the avalanche diode and a source connected to a junction node between microcells,
    a second transistor with a gate connected to the source of the second deactivation transistor, a drain connected to the drain of the first deactivation transistor and a source connected to an activation voltage,
    a third transistor with a gate connected to the active recharge activation point, a drain connected to the source of the first deactivation transistor and a source connected to the junction node between microcells, and
    a fourth transistor with a gate connected to the drain of the first and second transistors, a drain connected to the source of the second activation transistor and a source connected to earth.

4. The photomultiplier of claim 1, wherein the at least one macrocell further comprises a monostable for generating an active recharge signal connected to the active recharge activation point.

\* \* \* \* \*